(12) United States Patent
Torabi et al.

(10) Patent No.: US 7,743,277 B2
(45) Date of Patent: Jun. 22, 2010

(54) SYSTEM AND METHOD FOR DETECTING AND REDUCING DATA CORRUPTION IN A STORAGE DEVICE

(75) Inventors: Hooshmand Torabi, Irvine, CA (US); Chien-Hung Wu, Hsinchu (TW)

(73) Assignee: STEC, Inc., Santa Ana, CA (US)

( * ) Notice: Subject to any disclaimer, the term of this patent is extended or adjusted under 35 U.S.C. 154(b) by 484 days.

(21) Appl. No.: 11/352,654

(22) Filed: Feb. 13, 2006

(65) Prior Publication Data

US 2006/0181948 A1 Aug. 17, 2006

Related U.S. Application Data

(60) Provisional application No. 60/652,960, filed on Feb. 14, 2005.

(51) Int. Cl.
*G06F 11/00* (2006.01)
(52) U.S. Cl. .......................................... 714/22; 714/42
(58) Field of Classification Search ........................ None
See application file for complete search history.

(56) References Cited

U.S. PATENT DOCUMENTS

| 5,544,119 | A | * | 8/1996 | Wells et al. | ............. 365/185.11 |
| 6,513,095 | B1 | * | 1/2003 | Tomori | ......................... 711/103 |
| 2006/0143541 | A1 | * | 6/2006 | Kay | ............................ 714/42 |

* cited by examiner

*Primary Examiner*—Michael C Maskulinski
(74) *Attorney, Agent, or Firm*—McDermott Will & Emery LLP

(57) ABSTRACT

A data storage system using flash storage maintains a status indicator corresponding to data written into the flash storage. The status indictor of the data indicates whether a disruption, such as a power disruption or a device disconnection, occurred when the data was being written into the flash storage. The data storage system determines whether the data may be corrupted based on one or more of the status indictors. The data storage system may make this determination at a selected time or after a power-up of the data storage system. If the data is determined to possibly be corrupted, the data storage system may optionally discard the corrupted data from the flash storage or flag the corrupted data for future removal.

20 Claims, 4 Drawing Sheets

SYSTEM AND METHOD FOR DETECTING AND REDUCING DATA CORRUPTION IN A STORAGE DEVICE

CROSS-REFERENCE TO RELATED APPLICATIONS

This application claims benefit of U.S. provisional patent application No. 60/652,960 filed Feb. 14, 2005 and entitled "System and Method for Power-Down Recovery of Flash Memory," which is incorporated herein by reference.

BACKGROUND

1. Field of Invention

The present invention generally relates to computer memory and storage. More particularly, the present invention relates to a system and method of detecting and reducing data corruption after a power disruption occurs in a storage device.

2. Description of Related Art

An electronic or computing device may include flash storage for storing data. Although the flash storage retains data after the electronic device is turned off, the electronic device is generally sensitive to power disruptions during normal operation. Such power disruptions may be caused by several factors such as, for example, a result of battery discharge, power drop-off, power fluctuation, disconnection from or poor connection with a host device, interference, failure of a component or connection, or the like. Data written into the flash storage during power disruption is susceptible to corruption particularly if the power disruption occurs during the writing of data.

In light of the above, a need exists for a system and method to detect and reduce data corruption caused by a power disruption occurring in a storage device. Additionally, there exists a need for removing the corrupted data to increase storage space for subsequent or future use in the operation of the storage device.

SUMMARY

In various embodiments, a data storage system determines whether data written into flash storage is corrupted when a power disruption occurs in the data storage system. The data storage system maintains a status indicator for each data unit of a data block written into the flash storage. The status indictor of each data unit indicates whether a power disruption occurs when the data unit is written into the flash storage. The data storage system determines whether the data block is corrupted based on one or more of the status indictors. If the data block is corrupted, the data storage system may discard the data block.

A data storage system, in accordance with one embodiment, includes a data memory, an input buffer, and a controller coupled to the data memory and the input buffer. The input buffer is configured to receive a data block comprising at least one data unit. The controller is configured to write at least one data unit of the data block into a flash storage. Additionally, the controller is configured to set a status indicator in the data memory for each data unit of the data block written into the flash storage. The status indicator of a data unit in the data block indicates whether a power disruption occurs in the data storage system when the data unit is written into the flash storage.

In a further embodiment, the controller determines whether the data block is corrupted based on at least one status indictor. Also, if the controller determines the data block is corrupted, the controller discards from the flash storage each data unit of the data block written into the flash storage. The controller can erase a storage block in the flash storage to discard the data units of the data block written into the flash storage.

In a method, in accordance with one embodiment, a data block comprising at least one data unit is received. At least one data unit of the data block is written into flash storage. A status indicator is set for each data unit of the data block written into the flash storage. The status indictor for the data unit indicates whether a power disruption occurs in a data storage system containing the flash storage when the data unit is written into the flash storage.

In a further embodiment, a determination is made as to whether the data block is corrupted based on at least one status indictor. If the data block is determined to be corrupted, each data unit of the data block written into the flash storage is discarded from the flash storage. Each data unit of the data block written into the flash storage may be discarded by erasing a storage block in the flash storage.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DESCRIPTION

In various embodiments, a data storage system determines whether data written into a flash storage is corrupted when a power disruption occurs in the data storage system. If the data is corrupted, a management module discards the corrupted data from the flash storage after the data storage system subsequently receives adequate power or is powered-up.

Figure 1:
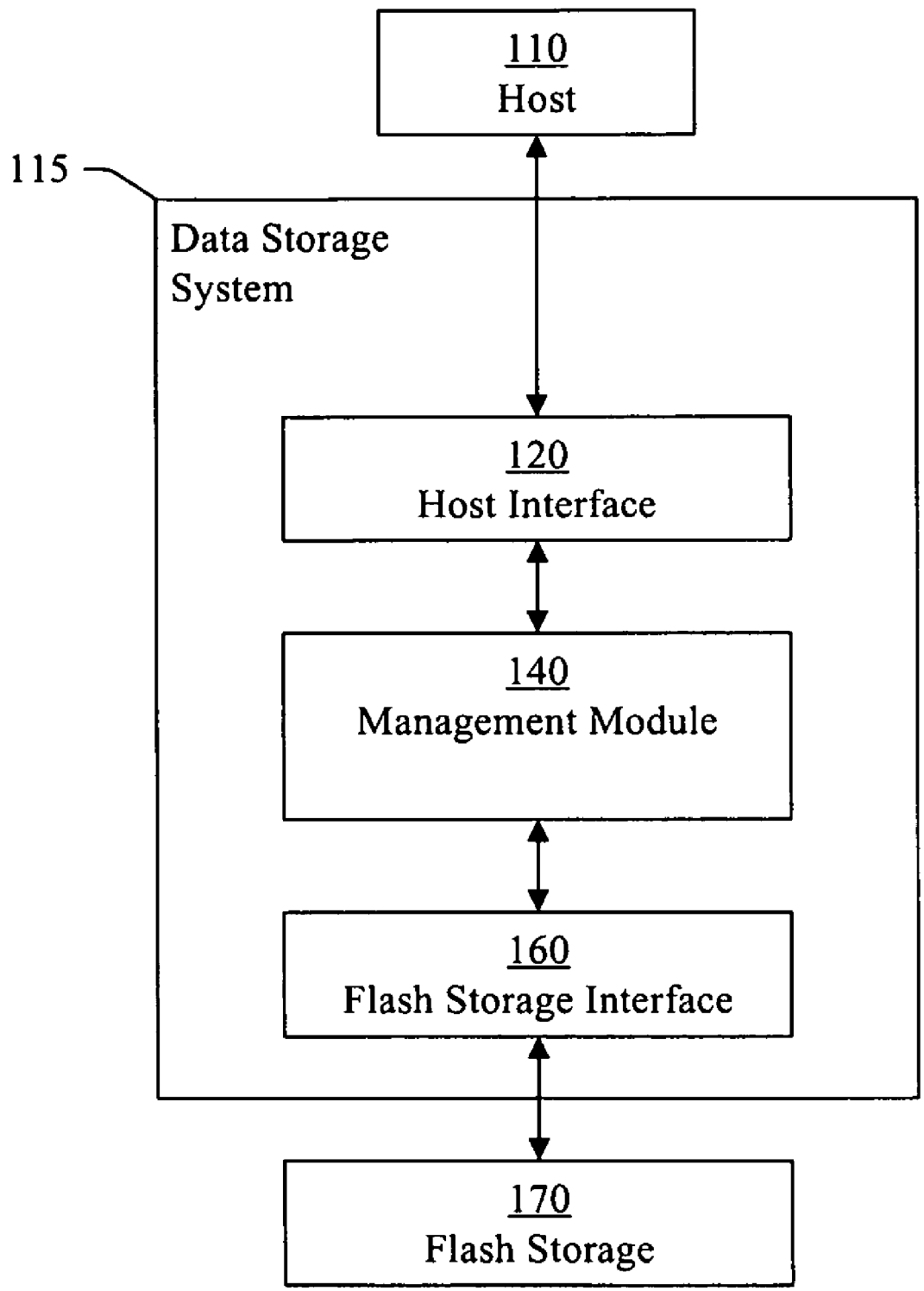
FIG. 1 is a block diagram of an electronic system, in accordance with an embodiment of the present invention.

FIG. 1 illustrates an electronic system 100, in accordance with an embodiment of the present invention. The electronic system 100 includes a host 110, a flash storage 170, and a data storage system 115 coupled in communication with the host 110 and the flash storage 170. The host 110 accesses data in the flash storage 170 via the data storage system 115. The host 110 may be any computing or electronic device, such as a computer workstation, a network router, a portable computer, a personal digital assistant, a digital camera, a digital phone, or the like. The data storage system 115 may be an embedded, internal, external, or removable device, or any type of peripheral device for the host 110. The flash storage 170 may be any flash storage device, such as a flash memory card, a secure digital (SD) cards, a universal serial bus (USB) memory device, a flash storage array, a CompactFlash card, or the like. In one embodiment, the data storage system 115 includes the flash storage 170.

The host 110 issues commands to the data storage system 115 for accessing data in the flash storage 170. The commands may include read commands or write commands. The data storage system 115 accesses data in the flash storage 170 based on the commands. Additionally, the data storage system 115 determines whether data written into the flash storage 170 is corrupted when a power disruption in the storage system 115, the host 110, or the flash storage 170 affects the data. If the data storage system 115 determines that the data written into the flash storage 170 is corrupted, the data storage system 115 discards the corrupted data from the flash storage 170. In this way, corrupted data is reduced in the flash storage 170. In another embodiment, the data storage system 115 may flag (with the flags being either internal or external to the flash storage 170) the corrupted areas of the flash storage 170 without immediately discarding the corrupted areas.

In one embodiment, the data storage system 115 discards the corrupted data by erasing a storage block containing the corrupted data in the flash storage 170. The storage block is then made available as part of a pool of available storage blocks in the flash storage 170. Thus, the data storage system 115 need not retire the storage block and replace the storage block with a spare storage block when the data storage system 115 determines that the data in the storage block is corrupted. In this way, replacement of storage blocks in the flash storage 170, by the use of the spare storage blocks, is reduced, which may increase the lifetime of the flash storage 170.

In one embodiment, the data storage system 115 includes a host interface 120, a management module 140, and a flash storage interface 160. The host interface 120 is coupled in communication with the host 110 and the management module 140, and facilitates communication between the host 110 and the management module 140. For example, the host interface 120 may transform a communication between a communication protocol of the host 110 and a communication protocol of the management module 140. In various embodiments, the host interface 120 is optional. In embodiments without the host interface 120, the management module 140 is coupled in communication with the host 110 instead of the host interface 120.

The flash storage interface 160 is coupled in communication with the management module 140 and the flash storage 170, and facilitates communication between the management module 140 and the flash storage 170. For example, the flash storage interface 160 may transform a communication between a communication protocol of the management module 140 and a communication protocol of the flash storage 170. In various embodiments, the flash storage interface 160 is optional. In embodiments without the flash storage interface 160, the management module 140 is coupled in communication with flash storage 170 instead of the flash storage interface 160.

Figure 2:
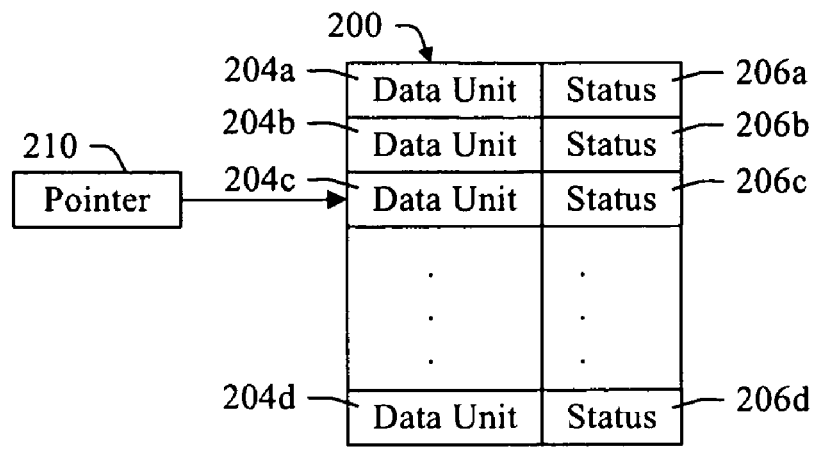
FIG. 2 is a schematic diagram of status indictors for a data block, in accordance with an embodiment of the present invention.

FIG. 2 illustrates a data block 200, in accordance with an embodiment of the present invention. The data block 200 may be any unit of storage, such as a memory page, a logical sector, a data record, or the like. The data block 200 includes one or more data units 204. Thus, a data unit 204 may be a portion of the data block 200, such as a data fragment, page, sector, or the like. Although four data units 204a-d are shown in FIG. 2, the data block 200 may have more or fewer data units 204. The management module 140 (FIG. 1) maintains a status indicator (status) 206 for some or all of the data units 204 in the data block 200. Although four status indicators 206a-d are shown in FIG. 2, the management module 140 can maintain more or fewer status indicators 206. In various embodiments, the status indicators may be maintained in various areas of the data storage system 115 or the flash storage 170. Moreover, the status indicators 206 may be maintained in a variety of data structures, such as tables, or maintained on the same area as the corresponding data units 204.

In one embodiment, the status indicator 206 of a data unit 204 indicates whether a power disruption, such as a power loss or a power fluctuation, occurs when the data unit 204 is written into the flash storage 170 (FIG. 1). The power disruption may occur in the host 110, the data storage system 115, the flash storage 170, any combination thereof, or outside of the foregoing. Moreover, generally, a power disruption in the host 110 or the data storage system 115 may cause a power disruption in the flash storage 170. For example, a power loss in the data storage system 115 may cause a power disruption to a signal received in the flash storage 170 from the data storage system 115. Additionally, the management module 140 maintains a pointer 210 (i.e., a source pointer) for identifying a current data unit 204 of the data block 200 to be written into the flash storage 170.

Figure 3:
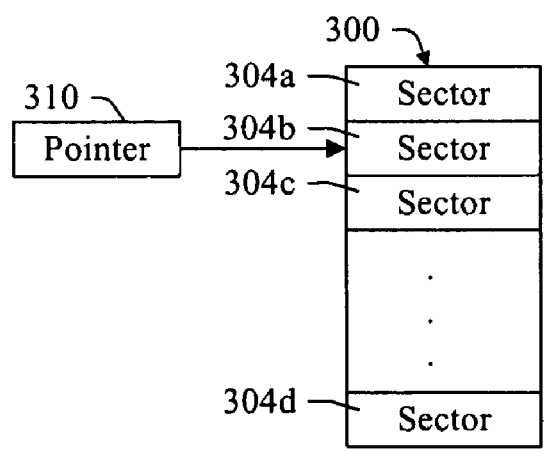
FIG. 3. is a schematic diagram of a storage block in a flash storage, in accordance with an embodiment of the present invention.

FIG. 3 illustrates a storage block 300 of the flash storage 170 (FIG. 1). The storage block 300 includes one or more sectors 304. Although four sectors 304a-d are shown in FIG. 3, the storage block 300 may have more or fewer sectors 304. The management module 140 (FIG. 1) maintains a pointer 310 (i.e., a destination pointer) identifying a current sector 304 of the storage block 300 in which a data unit 204 (FIG. 2) of the data block 200 (FIG. 2) is to be written.

Figure 4:
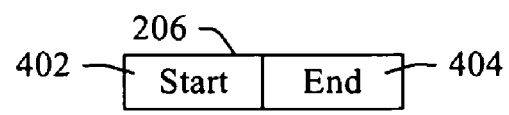
FIG. 4 is a schematic diagram of a status indictor, in accordance with an embodiment of the present invention.

FIG. 4 illustrates the status indicator 206, in accordance with an embodiment of the present invention. The status indicator 206 includes a start indicator (start) 402 and an end indicator (end) 404. The start indicator 402 may be a start flag and the end indicator 404 may be an end flag. The start indicator 402 for a data unit 204 (FIG. 2) indicates that the management module 140 (FIG. 1) is starting to write the data unit 204 into the flash storage 170 (FIG. 1). The management module 140 can set the start indicator 402 of the data unit 204 before or after issuing a write operation for the data unit 204 to the flash storage interface 160 (FIG. 1).

The end indicator 404 indicates that the management module 140 (FIG. 1) has completed writing the data unit 204 (FIG. 2) into the flash storage 170 (FIG. 1). If the management module 140 completes writing the data unit 204 into the flash storage 170 before any power disruption occurs in the flash storage 170, the management module 140 sets the end indicator 404 for the data unit. In one embodiment, the management module 140 monitors a power supply in the data storage device 115 (FIG. 1) to determine whether a power disruption occurs in the data storage device 115. In another embodiment, the management module 140 monitors a power supply of the flash storage 170 to determine whether a power disruption occurs in the data storage device 115 (FIG. 1). In another embodiment, the management module 140 does not monitor the power.

In another embodiment, the management module 140 (FIG. 1) and the flash storage 170 (FIG. 1) have the same power supply. In this embodiment, the management module 140 is powered-down if a power loss occurs in the power supply. Because the management module 140 is powered-down when a power loss occurs in the power supply, the management module 140 does not set the end indicator 404 of the data unit 204 written into the flash storage 170.

In a further embodiment, the management module 140 (FIG. 1) waits a predetermined period (e.g., a fixed number of clock cycles) before setting the end indicator 404 of the data unit 204 (FIG. 2). Thus, if power loss occurs in the data storage device 115 (FIG. 1) or the flash storage 170 before the predetermined period expires, the management module 140 does not set the end indicator 404 of the data unit 204 because the management module 140 is powered-down. In another further embodiment, the management module 140 waits a dynamically determined period (i.e., a dynamic period) before setting the end indicator 404 of the data unit 204. The management module 140 may determine the dynamic period based on a variety of factors, such as, operating conditions or parameters of the host 110 (FIG. 1), the data storage system 115, or the flash storage 170.

If a power disruption occurs in the data storage system 115 (FIG. 1) and the data storage system 115 is subsequently powered-up, or receives adequate power, the management module 140 (FIG. 1) determines whether any data unit 204 (FIG. 2) of the data block 200 (FIG. 2) is corrupted based on the start indicator 402 and the end indictor 404 of the data unit 204. If the start indicator 402 of the data unit 204 is set but the end indicator 404 of the data unit 204 is not set, the management module 140 determines that the data unit 204 is corrupted.

In one embodiment, if the management module 140 (FIG. 1) determines that a data unit 204 (FIG. 2) of the data block 200 (FIG. 2) is corrupted, the management module 140 also determines that the data block 200 is corrupted. In another embodiment, if the management module 140 determines that no data unit 204 of the data block 200 is corrupted but that both the start indicator 402 and the end indictor 404 of a data unit 204 in the data block 200 are not set, the management module 140 determines that the data block 200 is corrupted. The management module 140 can determine at a selected time, at a dynamically determined time, or in response to a power-up of the data management system 115, whether the data block 200 is corrupted.

In one embodiment, the management module 140 (FIG. 1) sets the pointer 210 (FIG. 2) to the current data unit 204 (FIG. 2) to be written into the storage block 300 (FIG. 3). Additionally, the management module 140 sets the pointer 310 (FIG. 3) to the current sector 304 (FIG. 3) of the storage block 300 in which the data unit 204 is to be written. If power disruption occurs in the data storage system 115 (FIG. 1) when the data unit 204 is written into the storage block 300, the management module 140 maintains the pointers 210 and 310. After the data storage system 115 is subsequently powered-up, the management module 140 can identify the last data unit 204 written into the storage block 300 based on the pointers 210 and 310.

Figure 5:
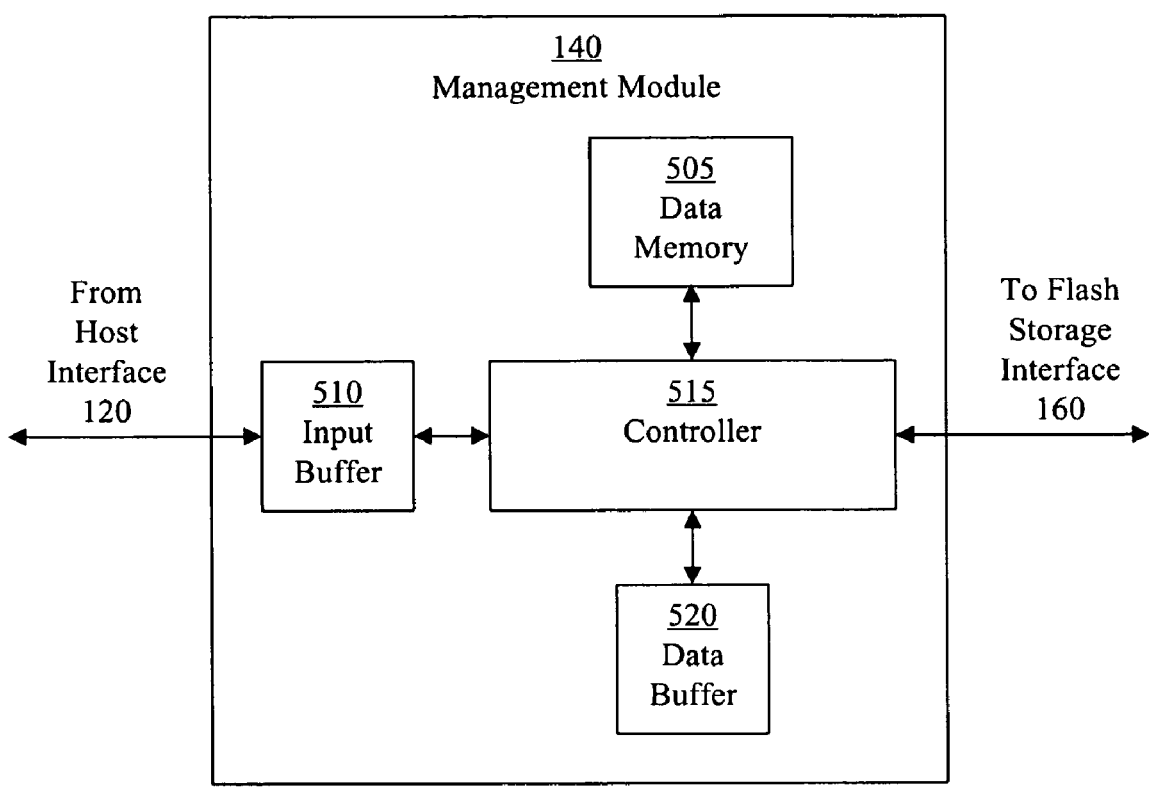
FIG. 5 is a block diagram of a management module, in accordance with an embodiment of the present invention.

FIG. 5 is a block diagram of the management module 140 of FIG. 1, in accordance with an embodiment of the present invention. The management module 140 includes a data memory 505, an input buffer 510, a controller 515, and a data buffer 520. The controller 515 is coupled in communication with the data memory 505, the input buffer 510, and the data buffer 520. Additionally, the controller 515 is coupled in communication with the flash storage interface 160 (FIG. 1). The controller 515 controls operation of the management module 140. The controller 515 may be a microprocessor, a microcontroller, an embedded controller, a logic circuit, a flash controller, or any kind of processing device.

The input buffer 510 may receive a write command from the host interface 120 (FIG. 1) for writing a data block 200 (FIG. 2) into the flash storage 170 (FIG. 1). The data block 200 includes one or more data units 204 (FIG. 2) to be written into one or more storage blocks 300 (FIG. 3) of the flash storage 170. The controller 515 selects one or more available storage blocks 300 (e.g., an erased or available storage block) in the flash storage 170. The controller 515 then issues a write operation to the flash storage interface 160 (FIG. 1) for each data unit 204 of the data block 200 to be written into the selected storage blocks 300 of the flash storage 170. In turn, the flash storage interface 160 facilitates the write operation for each data unit 204 to write the data unit 204 into one of the selected storage blocks 300 of the flash storage 170.

In some cases, a power disruption may occur in the flash storage 170 (FIG. 1), or will affect the flash storage 170, before all of the data units 204 (FIG. 2) of the data block 200 (FIG. 2) are written into the flash storage 170. If a power disruption occurs when a data unit 204 of the data block 200 is written into the flash storage 170, the controller 515 stores the status indictor 206 (FIG. 2) of the data unit 204 into the data memory 505 indicating that a power disruption occurred when the data unit 204 is written into the flash storage 170.

After the flash storage 170 (FIG. 1) is subsequently powered-up, the controller 515 determines whether any data unit 204 (FIG. 2) of the data block 200 (FIG. 2) written into the flash storage 170 is corrupted based on the status indicator 206 (FIG. 2) of the data unit 204. The controller 515 can determine at a selected time or in response to a power-up of the data storage system 115 whether any data unit 204 of the data block 200 written into the flash storage 170 is corrupted. Additionally, the controller 515 can determine whether the data block 200 written into the flash storage 170 is corrupted based on the status indicator 206 of a data unit 204 in the data block 200.

If the controller 515 determines that the data block 200 (FIG. 2) written into the flash storage 170 (FIG. 1) is corrupted, the controller 515 can then issue an erase operation through the flash storage interface 160 (FIG. 1) for discarding the corrupted data block 200 from the flash storage 170. In turn, the flash storage interface 160 facilitates the erase operation to discard the data units 204 (FIG. 2) of the corrupted data block 200 from the flash storage 170. For example, controller 515 can cause the erase of each storage block 300 (FIG. 3) in the flash storage 170 containing one of the data units 204 of the corrupted data block 200 in the flash storage 170.

The input buffer 510 may receive a write command from the host 110, through the host interface 120 (FIG. 1), for writing a data block 200 (FIG. 2) into the flash storage 170 (FIG. 1) to replace one or more data units 204 (FIG. 2) of an existing data block 200 in the flash storage 170. The data block 200 of the write command includes one or more modified data units 204 to replace respective data units 204 in the existing data block 200. The remaining data units 204 of the data block 204 to be written into the flash storage 170 include the remaining data units 204 of the existing data block 200. Thus the remaining data units 204 of the existing data block 200 are to be copied in the flash storage 170 as a result of the write command.

The controller 515 selects an available storage block 300 (FIG. 3) (e.g., an erased storage block) in the flash storage 170 (FIG. 1) and issues a write operation through the flash storage interface 160 (FIG. 1) for each data unit 204 (FIG. 2) of the data block 200 (FIG. 2) in the write operation. After the controller 515 writes all of the data units 204 of the data block 200 into the selected storage block 300, the controller 515 erases the storage block 300 containing the existing data block 200, and maps a memory address of the existing storage block 300 to the selected storage block 300. In this way, the data block 200 written into the selected storage block 300 replaces the existing data block 200 in the flash storage 170.

If a power disruption occurs when a data unit 204 (FIG. 2) of the data block 200 (FIG. 2) is written into the flash storage 170 (FIG. 1), the controller 515 stores the status indictor 206 (FIG. 2) of the data unit 204 into the data memory 505 indicating that a power disruption occurred when the data unit 204 is written into the flash storage 170. Moreover, the controller 515 does not erase the storage block 300 (FIG. 3) containing the existing data block 200 or map the address of the storage block 300 containing the existing data block 200 to the selected storage block 300 because the write operation is not complete.

After the flash storage 170 (FIG. 1) is subsequently powered-up, the controller 515 determines whether the data block 200 (FIG. 2) written into the selected storage block 300 (FIG. 3) is corrupted based on the status indicator 206 (FIG. 2) of one or more data units 204 (FIG. 2). The controller 515 can then discard the data units 204 of the data block 200 written into the selected storage block 300. In this way, the existing data block 200 is recovered for future use in the flash storage 170. Moreover, data corruption is reduced in the flash storage 170.

In one embodiment, the data memory 505 or a portion thereof is a non-volatile memory. The controller 515 stores the status indicators 206 (FIG. 2) of data units 204 (FIG. 2) of a data block 200 (FIG. 2) into the non-volatile memory. Thus, if a power loss occurs in both the flash storage 170 (FIG. 1) and the management module 140 (FIG. 1), the controller 515 can determine after subsequent power-up of the flash storage 170 and the management module 140 whether the data block 200 (FIG. 2) is corrupted.

In other embodiments, the data memory 505 includes the input buffer 510 or the data buffer 520, or both. For example, the input buffer 510 or the data buffer 520 may be memory locations in the data memory 505. In embodiments in which the data memory 505 includes the input buffer 510, the controller 515 is coupled in communication with the host interface 120 (FIG. 1).

Figure 6:
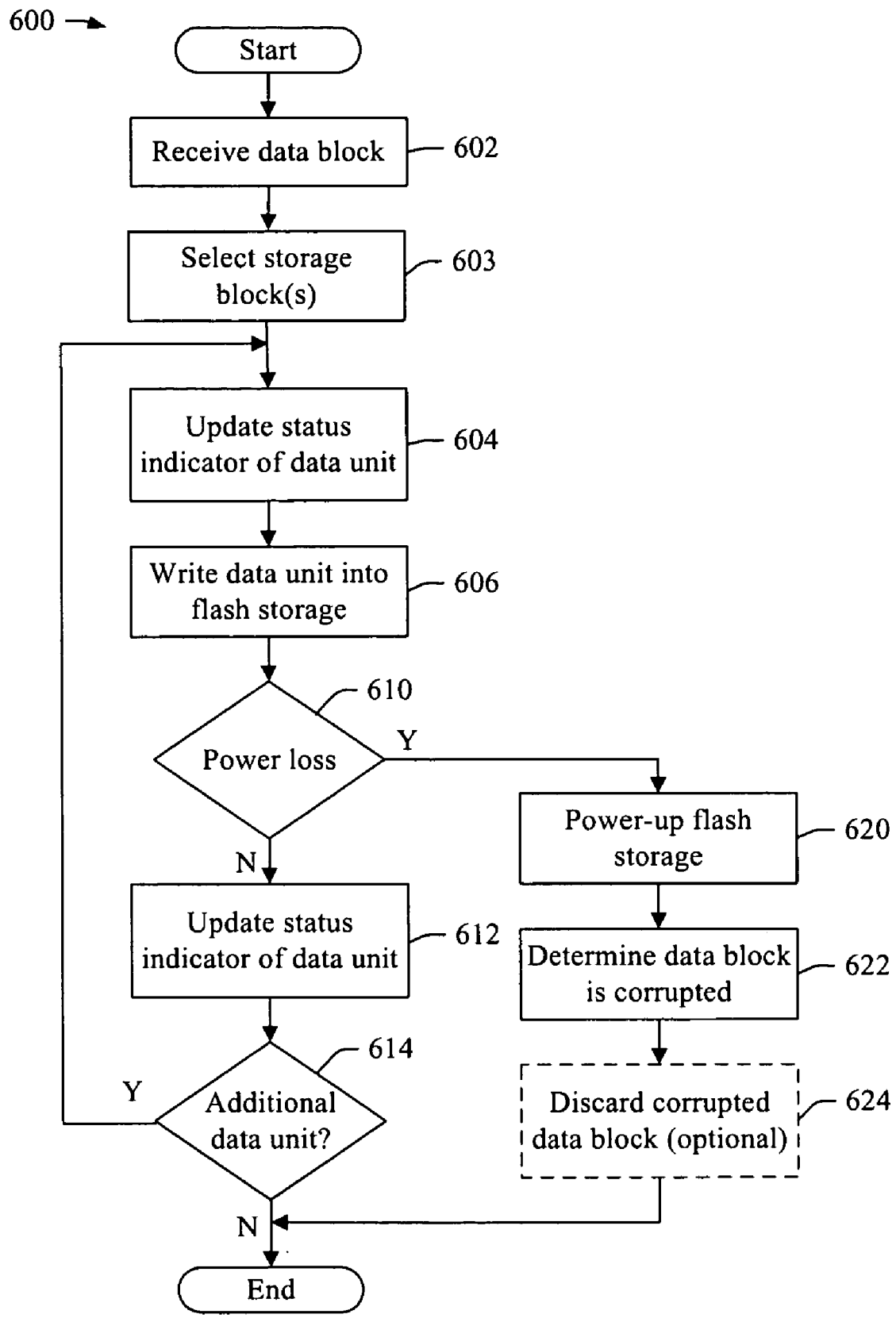
FIG. 6 is a flow chart for a method of determining whether power disruption occurs when writing data into the flash storage, in accordance with an embodiment of the present invention.

FIG. 6 illustrates a method 600 of determining whether a power disruption occurs when writing data into the flash storage 170 (FIG. 1), in accordance with one embodiment of the present invention. In step 602, a data block 200 (FIG. 2) is received. The data block 200 includes one or more data units 204 (FIG. 2). In one embodiment, the management module 140 (FIG. 1) receives the data block 200 in a write operation. For example, the host 110 (FIG. 1) can issue a write operation containing the data block 200 to the host interface 120 (FIG. 1), and the host interface 120 can provide the write command to the management module 140. The method 600 then proceeds to step 603.

In step 603, a storage block 300 (FIG. 3) in the flash storage 170 (FIG. 1) is selected. In one embodiment, the management module 140 (FIG. 1) selects an available storage block 300 (i.e., an erased storage block) in the flash storage 170. The method 600 then proceeds to step 604.

In step 604, the status indicator 206 (FIG. 2) of a next data unit 204 (FIG. 2) to be written into the flash storage 170 (FIG. 1) is written or updated. In one embodiment, the management module 140 (FIG. 1) sets a start indicator 402 (FIG. 4) of the status indictor 206 for the data unit 204 to indicate that the management module 120 is starting to write the data unit 204 into the flash storage 170. The method 600 then proceeds to step 606.

In step 606, the data unit 204 (FIG. 2) is written into the selected storage block 300 (FIG. 3) of the flash storage 170 (FIG. 1). In one embodiment, the management module 140 (FIG. 1) writes the data unit 204 into the selected storage block 300 via the flash storage interface 160 (FIG. 1). The method 600 then proceeds to step 610.

In step 610, a power disruption may occur in the data storage system 115 (FIG. 1). For example, a power disruption may occur in the data storage system 115 when a power supply in the data storage system 115 fails or when the flash storage 170 is disconnected (e.g., unplugged or removed) from the data storage system 115. As another example, a power disruption may occur in the data storage system 115 when the data storage system 115 is disconnected (e.g., unplugged or removed) from the host 110.

In one embodiment, the flash storage 170 (FIG. 1) and the management module 140 (FIG. 1) have the same power supply. In this embodiment, power disruption occurs in the flash storage 170 when a power disruption occurs in the management module 140. For example, the power disruption in the management module 140 can be a power loss in the power supply. If power disruption does not occur in the data storage system 115 (FIG. 1), the method 600 proceeds to step 612, otherwise the method proceeds to step 620.

In step 612, arrived at from step 610 in which a power disruption does not occur in the data storage system 115 (FIG. 1), the status indictor 206 (FIG. 2) of the data unit 204 (FIG. 2) is updated to indicate that a power disruption does not occur in the data storage system 115 (i.e. the write operation was successfully completed) when the data unit 204 is written into the flash storage 170 (FIG. 1). In one embodiment, the management module 140 (FIG. 1) updates the status indicator 206 by setting the end indicator 404 (FIG. 4) of the status indicator 206 for the data unit 204 to indicate that the management module 140 completes writing the data unit 204 into the flash storage 170. The method 600 then proceeds to step 614.

In step 614, a determination is made as to whether the data block 200 (FIG. 2) includes an additional data unit 204 (FIG. 2). In one embodiment, the management module 140 (FIG. 1) determines whether the data block 200 includes an additional data unit 204 not written into the flash storage 170 (FIG. 1). If the data block 200 includes an additional data unit 204 not written into the flash storage 170, the method 600 returns to step 604, otherwise the method ends.

In step 620, arrived at from step 610 in which a power disruption occurs in the data storage system 115 (FIG. 1), the flash storage 170 (FIG. 1) is powered-up or receives adequate power. In embodiments in which the management module 140 (FIG. 1) and the flash storage 170 have the same power supply, the management module 140 is also powered-up in step 620. For example, the flash storage 170 may be powered-up by reconnecting a power supply to the flash storage 170. The method 600 then proceeds to step 622.

In step 622, the data block 200 (FIG. 2) written into the storage block 300 (FIG. 3) of the flash storage 170 (FIG. 1) is determined to be corrupted based on one or more status indicators 206 (FIG. 2) of the data block 200. In one embodiment, the management module 140 (FIG. 1) determines that the data block 200 is corrupted based on the status indicators 206 of the data units 204 (FIG. 2) in the data block 200. If the status indictor 206 of a data unit 204 in the data block 200 has a start indicator 402 (FIG. 4) that is set and an end indicator 404 (FIG. 4) that is not set, the management module 140 determines that the data unit 204 is corrupted. Moreover, the management module 140 can determine that the data block 200 written into the flash storage 170 is also corrupted. In another embodiment, the management module 140 determines the data block 200 is corrupted because at least one of the end indicators 404 of a data unit 204 in the data block 202 is not set.

In one embodiment, the management module 140 (FIG. 1) marks the data block 200 (FIG. 2) as being corrupted. The management module 140 can then identify the data block 200, as well as other corrupted data blocks 200, for further processing. In another embodiment, the management module 140 marks the storage block 300 (FIG. 3) for erasure. The management module 140 can then identify and erase the storage block 300, as well as other storage blocks 300 containing corrupted data units 204 (FIG. 2) as a result of power disruptions. If the method 600 includes optional step 624, the method 600 then proceeds to step 624. Otherwise the method ends.

In optional step 624, the corrupted data block 200 (FIG. 2) is discarded from the flash storage 170 (FIG. 1). In one embodiment, the management module 140 (FIG. 1) discards the corrupted data block 200 from the flash storage 170 by erasing each storage block 300 (FIG. 3) in the flash storage 170 containing a data unit 204 (FIG. 2) of the data block 200. The method then ends.

Although the invention has been described with reference to particular embodiments thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A data storage system comprising:
a data memory configured to receive a data block comprising at least one data unit; and
a controller coupled to the data memory and configured to write at least one data unit of the data block into a flash storage, the controller further configured to set a status indicator in the data memory for each data unit of the data block written into the flash storage indicating whether a power disruption occurs in the data storage system when the data unit is written into the flash storage,
wherein, while writing the at least one data unit of the data block into the flash storage, the controller is further configured to maintain a first pointer identifying a current data unit of the data block to be written into the flash storage and a second pointer identifying a sector of the flash storage into which the current data unit is to be written.

2. The data storage system of claim 1, wherein the controller is further configured to determine whether the data block in the flash storage is corrupted based on at least one status indictor.

3. The data storage system of claim 1, wherein the status indictor for a first data unit of the data block comprises a start indicator indicating the first data unit is to be written into the flash storage.

4. The data storage system of claim 3, wherein the status indicator for the first data unit comprises an end indicator indicating the first data unit is written into the flash storage without a power disruption occurring in the data storage system.

5. The data storage system of claim 1, further comprising a data buffer coupled to the controller, the controller further configured to store the data block into the data buffer.

6. The data storage system of claim 1, further comprising an input buffer coupled to the controller, the input buffer configured to receive the data block.

7. The data storage system of claim 1, wherein at least a portion of the data memory is a non-volatile memory.

8. The data storage system of claim 1, wherein the controller is further configured to respond to a power-up of the data storage system by determining whether the data block is corrupted based on at least one status indictor.

9. The data storage system of claim 8, wherein the controller is further configured to discard each data unit of the data block written into the flash storage if the data block is determined to be corrupted.

10. The data storage system of claim 8, wherein the controller is further configured to discard each data unit of the data block written into the flash storage by erasing each data unit of the data block written into the flash storage.

11. The data storage system of claim 1, wherein the power disruption is a power loss occurring in the data storage system.

12. A method comprising:
receiving a data block comprising at least one data unit;
writing at least one data unit of the data block into a flash storage;
setting a status indicator for each data unit of the data block written into the flash storage indicating whether a power disruption occurs in a data storage system containing the flash storage when the data unit is written into the flash storage;
maintaining a first pointer identifying a current data unit of the data block to be written into the flash storage, while writing the at least one data unit of the data block into the flash storage; and
maintaining a second pointer identifying a sector of the flash storage into which the current data unit is to be written, while writing the at least one data unit of the data block into the flash storage.

13. The method of claim 12, further comprising determining whether the data block is corrupted based on at least one status indictor.

14. The method of claim 12, wherein the status indicator for a first data unit of the data block comprises a start indicator indicating the first data unit is to be written into the flash storage.

15. The method of claim 14, wherein the status indictor for the first data unit comprises an end indicator indicating the first data unit is written into the flash storage without a power disruption occurring in the data storage system.

16. The method of claim 12, further comprising responding to a power-up of the data storage system by determining whether the data block is corrupted based on the at least one status indictor.

17. The method of claim 16, further comprising discarding each data unit of the data block written into the flash storage if the data block is determined to be corrupted.

18. The method of claim 17, wherein discarding each data unit of the data block written in the flash storage comprises erasing the data block in the flash storage.

19. The method of claim 12, wherein the power disruption is a power loss occurring in the data storage system.

20. A data storage system comprising:
means for receiving a data block comprising at least one data unit;
means for writing at least one data unit of the data block into a flash storage;
means for setting a status indicator for each data unit written into the flash storage indicating whether a power disruption occurs in the data storage system when the data unit is written into the flash storage;
means for maintaining a first pointer identifying a current data unit of the data block to be written into the flash storage, while writing the at least one data unit of the data block into the flash storage;

means for maintaining a second pointer identifying a sector of the flash storage into which the current data unit is to be written, while writing the at least one data unit of the data block into the flash storage; and means for determining whether the data block is corrupted based on at least one status indicator.

* * * * *